United States Patent
Araki (10) Patent No.: US 7,609,361 B2
(45) Date of Patent: Oct. 27, 2009

(54) SUBSTRATE PROCESSING METHOD AND SUBSTRATE PROCESSING SYSTEM

(75) Inventor: Shinichiro Araki, Koshi (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 12/031,263

(22) Filed: Feb. 14, 2008

(65) Prior Publication Data

US 2008/0212048 A1 Sep. 4, 2008

(30) Foreign Application Priority Data

Feb. 14, 2007 (JP) ............................. 2007-033041

(51) Int. Cl.
G03B 27/52 (2006.01)
G03B 27/42 (2006.01)
G03B 27/32 (2006.01)
G03D 5/00 (2006.01)

(52) U.S. Cl. .............................. 355/30; 355/27; 355/53; 355/77; 356/611

(58) Field of Classification Search ................... 355/30, 355/53, 67, 75, 77; 396/571, 611, 578
See application file for complete search history.

(56) References Cited

U.S. PATENT DOCUMENTS 7,241,061 B2 * 7/2007 Akimoto et al. ............. 396/611

(Continued)

FOREIGN PATENT DOCUMENTS

JP 3582820 8/2004

(Continued)

OTHER PUBLICATIONS

English Translation of JP 2006-080404 (dated Mar. 23, 2006).*

(Continued)

*Primary Examiner*—Alan A Mathews
(74) *Attorney, Agent, or Firm*—Oblon, Spivak, McClelland, Maier & Neustadt, L.L.P.

(57) ABSTRACT

A substrate processing method and a substrate processing system exclude wafers W provided with a protective film having surface defects that will cause components of a resist to dissolve in an immersion liquid during an immersion exposure process, and rated abnormal from those to be processed by the immersion exposure process. The substrate processing system is provided with a protective film forming module for forming a protective film on a resist film formed on a surface of a wafer W, an exposure system 4 for processing the surface of the wafer W coated with a transparent immersion liquid layer by an immersion exposure process, and a developing module 28 for processing the wafer W by a developing process using a developer. A protective film inspecting device 33 detects surface defects in a protective film formed on a wafer W. A control computer 60 decides whether or not surface defects detected by the protective film inspecting device 33 is normal on the basis of information about the surface defects provided by the protective film inspecting device 33, and gives a control signal representing the results of decision to the exposure system 4. The control computer 60 gives an exposure process execution signal requesting processing the wafer W by the exposure process to the exposure system 4 when the surface defects in the protective film are rated normal or gives an exposure process not executing signal requesting not processing the substrate by the exposure process to the exposure system when the surface defects in the protective film are rated abnormal.

2 Claims, 7 Drawing Sheets

U.S. PATENT DOCUMENTS

2007/0177869 A1 * 8/2007 Yamamoto et al. .......... 396/611
2007/0252960 A1 * 11/2007 Kida ........................... 355/30

FOREIGN PATENT DOCUMENTS

| JP | 2005-294520 | 10/2005 | |
| JP | 2006-80404 | 3/2006 | |
| WO | WO 2006/062188 A1 * | 6/2006 | |

OTHER PUBLICATIONS

English Translation of JP 2001-274057 (dated Oct. 5, 2002).*

* cited by examiner

SUBSTRATE PROCESSING METHOD AND SUBSTRATE PROCESSING SYSTEM

BACKGROUND OF THE INVENTION

1. Field of the Invention

The present invention relates to a substrate processing method and a substrate processing system. More specifically, the present invention relates to a substrate processing method and a substrate processing system for processing a substrate provided with a resist film and a protective film overlying the resist film by an immersion exposure process that forms an immersion liquid layer on the protective film.

2. Description of the Related Art

A photoresist pattern forming process, namely, one of processes for fabricating a semiconductor device, coats a surface of a semiconductor wafer (hereinafter, referred to simply as "wafer") with a resist film, exposes the resist film through a mask provided with a predetermined pattern, and develops the exposed resist film to form a resist pattern.

Recently, progressive miniaturization of device patterns and progressive thickness reduction of film require further improvement of exposure resolution. An immersion exposure method is one of methods intended to increase resolution by improving exposure techniques using an existing light source, such as an argon fluoride (ArF) light source or a krypton fluoride (KrF) light source. The immersion exposure method subjects a wafer to an exposure process after forming a transparent immersion liquid layer on a surface of the wafer. The immersion exposure technique passes light through, for example, pure water to utilize the effect of pure water to shorten the wavelength of light. The wavelength of light emitted by an ArF light source shortens from 198 nm to 134 nm in water. immersion liquid layer (liquid film) between a lens and a surface of a wafer, projects light by a light source through the liquid film on the wafer to transfer a predetermined resist pattern (circuit pattern) on a resist film formed on the wafer. In this state, where the liquid film is formed on the wafer, the exposure device is slid horizontally relative to the wafer to dispose the exposure device at a position corresponding to the next transfer area (shot area), and then projects light on the wafer. This procedure is repeated to transfer the circuit pattern in order to shot areas on the surface of the wafer.

Since the immersion exposure technique forms the liquid film (immersion liquid layer) in a space between a lens and a surface of a wafer, a very small amount of part of the components of the resist dissolves into the liquid film. Eluted components adhere to the surface of the lens to deteriorate the accuracy of the line width of the circuit pattern transferred to the wafer. Even if the eluted components do not adhere to the surface of the lens, an eluate contained in the liquid film affects the refractive index of the liquid film. Consequently, the resolution is deteriorated and the intrasurface accuracy of line width becomes irregular.

A method proposed in JP-A 2006-80404 (Claims, Paragraphs 0009, 0015, 0017, and FIG. 10) to solve the foregoing problems coats the resist film with an antireflection film (protective film).

The surface of the protective film is not necessarily uniformly flat and, in some cases, surface defects, such as depressions, are formed in the surface. The problem attributable to the dissolution of the components of the resist film does not arise when the surface does not have many surface defects. However, it is possible that the components of the resist film dissolves through the surface defects in the immersion liquid layer during the immersion exposure process, the dissolved components adhere to the lens and, consequently, the accuracy of line width of the circuit pattern is reduced and the accuracy of line width becomes possible when the surface has many surface defects.

SUMMARY OF THE INVENTION

The present invention has been made in view of the foregoing problems and it is therefore an object of the present invention to provide a substrate processing method and a substrate processing system that exclude substrates having a protective film abnormally having surface defects and having a possibility of permitting the components of a resist film to dissolve into an immersion liquid layer during an immersion exposure process from processing by an immersion exposure process.

A substrate processing method in a first aspect of the present invention includes the steps of: coating a surface of a substrate with a resist film; coating the surface of the resist film with a protective film; processing the surface of the substrate by an exposure process with the surface of the substrate coated with a transparent immersion liquid layer; and processing the surface of the substrate by a developing process; wherein surface defects in the surface of the protective film are detected by a protective film inspecting means before subjecting the substrate provided with the protective film to the exposure process by an exposure system, a decision is made to see whether or not the surface defects in the surface of the protective film is normal when the protective film is wetted with the immersion liquid layer, and the substrate is subjected to the exposure process when it is decided that the surface defects are normal or is not subjected to the exposure process when it is decided that the surface defects are abnormal.

In the substrate processing method according to the present invention, the exposure system is provided with an immersion liquid supply unit for supplying the immersion liquid into a space between an exposure lens and the surface of the substrate, a cleaning liquid supply unit for supplying a lens cleaning liquid for cleaning the exposure lens into the space between the exposure lens and the surface of the substrate, and shutoff valves placed in supply lines connected to the immersion liquid supply unit and the cleaning liquid supply unit, respectively, to supply the immersion liquid or the lens cleaning liquid selectively, and the shutoff valves are operated according to the degree of surface defects in the protective film to supply the lens cleaning liquid for a lens cleaning process after the completion of the exposure process when the surface defects in the protective film are normal.

A substrate processing system in a second aspect of the present invention, for carrying out the substrate processing method according to the present invention, provided with a resist film forming module for forming a resist film on a surface of a substrate, a protective film forming module for forming a protective film on the resist film, an exposure system for processing the surface of the substrate coated with a transparent immersion liquid layer by an exposure process, and a developing module for processing the substrate by a developing process using a developer; including: a protective film inspecting means for inspecting the surface of a protective film formed on a surface of the substrate; and a control means that receives information about the result of inspection of the protective film from the protective film inspecting means, rates surface defects in the surface of the protective film, and gives an exposure process execution signal requesting processing the substrate by the exposure process to the exposure system when the surface defects in the protective film are rated normal or gives an exposure process not executing signal requesting not processing the substrate by the exposure process to the exposure system when the surface defects in the protective film are rated abnormal.

In the substrate processing system according to the present invention, the exposure system is provided with an immersion liquid supply unit for supplying an immersion liquid into a space between an exposure lens and the surface of the substrate, a cleaning liquid supply unit for supplying a lens cleaning liquid for cleaning the exposure lens into the space between the exposure lens and the surface of the substrate, and shutoff valves placed in supply lines respectively connected to the immersion liquid supply unit and the cleaning liquid supply unit, respectively, to supply the immersion liquid or the lens cleaning liquid selectively, and the shut off valves are operated by control signals provided by the control means according to the degree of surface defects to supply the lens cleaning liquid for a lens cleaning process after the completion of the exposure process when the surface defects in the protective film are rated normal.

The substrate processing method and the substrate processing system according to the present invention inspect the surface of the protective film for surface defects by the protecting film inspecting means to determine the condition of surface defects before the substrate is subjected to the exposure process by the exposure system, and decide whether the surface defects in the protective film are normal or whether the surface defects in the protective film are abnormal when the surface of the substrate is coated with the immersion liquid layer for the exposure process. When the surface defects in the protective film of the substrate are rated abnormal, the exposure system sends out (excludes) the substrate without processing the substrate by the exposure process, and processes only substrates each coated with a protective film having surface defects rated normal.

In the substrate processing method and the substrate processing system according to the present invention, the exposure system is provided with the immersion liquid supply unit for supplying the immersion liquid into a space between the exposure lens and the surface of the substrate, the cleaning liquid supply unit for supplying the lens cleaning liquid for cleaning the exposure lens into the space between the exposure lens and the surface of the substrate, and the shutoff valves placed in the supply lines connected to the immersion liquid supply unit and the cleaning liquid supply unit, respectively, to supply the immersion liquid or the lens cleaning liquid selectively. The substrate processing method and the substrate processing system can carry out the lens cleaning process by operating the shutoff valves according to the degree of surface defects, namely, a degree at which the number of surface defects is not abnormally large but it is possible that the components of the resist film will slightly dissolve into the immersion liquid, to supply the lens cleaning liquid for the lens cleaning process after the completion of the exposure process or periodically after the completion of predetermined cycles of the exposure process when the surface defects in the protective film are rated normal, by using a dummy substrate for the cleaning process disposed opposite to the exposure lens instead of the substrate.

The present invention has the following effects.

(1) The substrate processing method and the substrate processing system according to the present invention do not process a substrate provided with a protective film having surface defects rated abnormal by the exposure process, and can process only substrates provided with a protective film having surface defects rated normal by the exposure process. Thus the dissolution f the components of the resist film into the immersion liquid and the adhesion of those components to the exposure lens during the immersion exposure process can be prevented and accurate exposure can be ensured.

(2) The substrate processing method and the substrate processing system according to the present invention can carry out the lens cleaning process according to the degree of surface defects, namely, a degree at which the number of surface defects is rated not abnormal but it is possible that the components of the resist film will slightly dissolve into the immersion liquid, after the completion of the exposure process or periodically after the completion of predetermined cycles of the exposure process. Therefore, the soiling of the exposure lens can be more effectively prevented.

DESCRIPTION OF THE PREFERRED EMBODIMENTS

Figure 1:
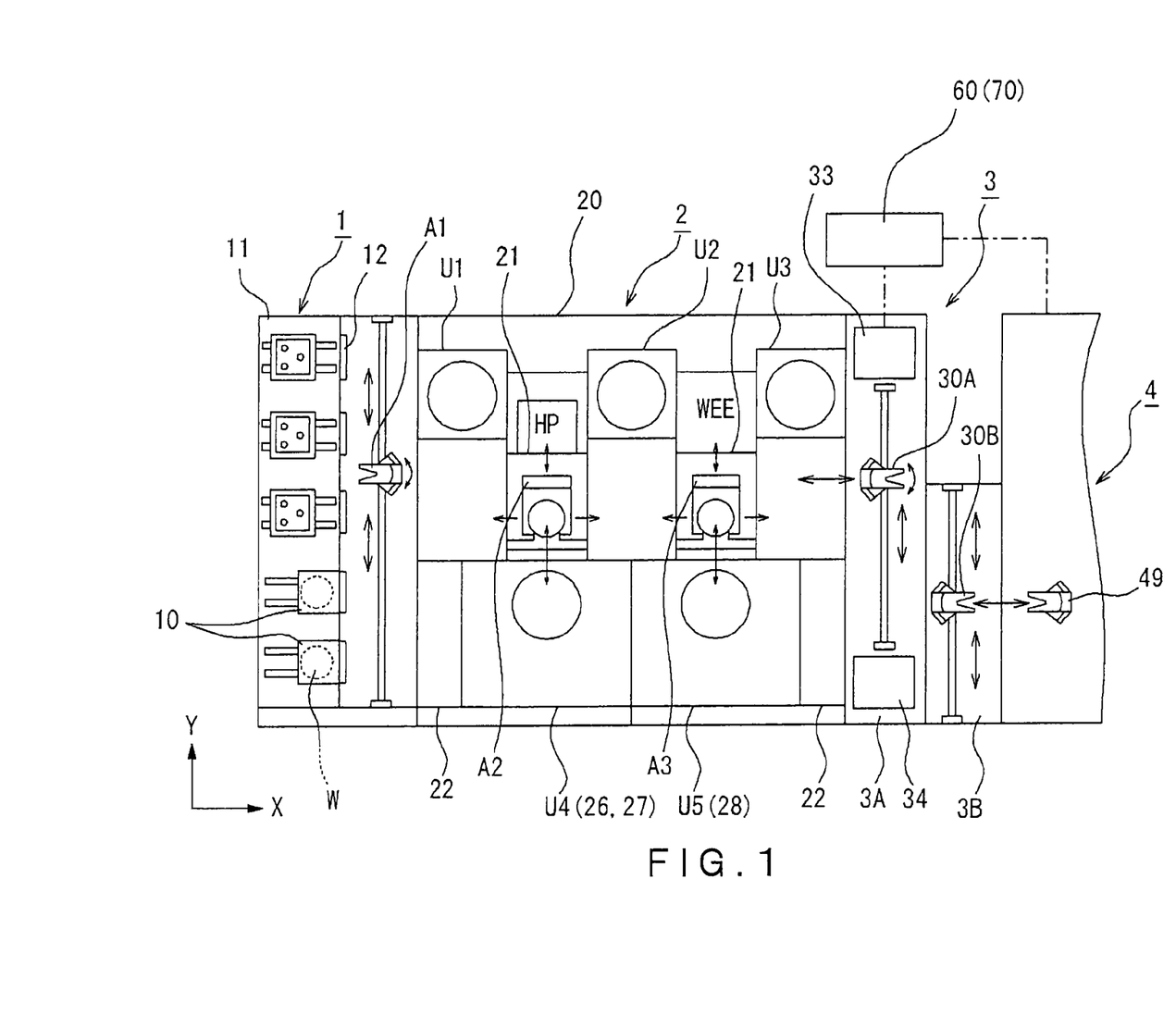
FIG. 1 is a schematic plan view of a substrate processing system in a preferred embodiment according to the present invention built by combining a coating and developing system and an exposure system.
Figure 2:
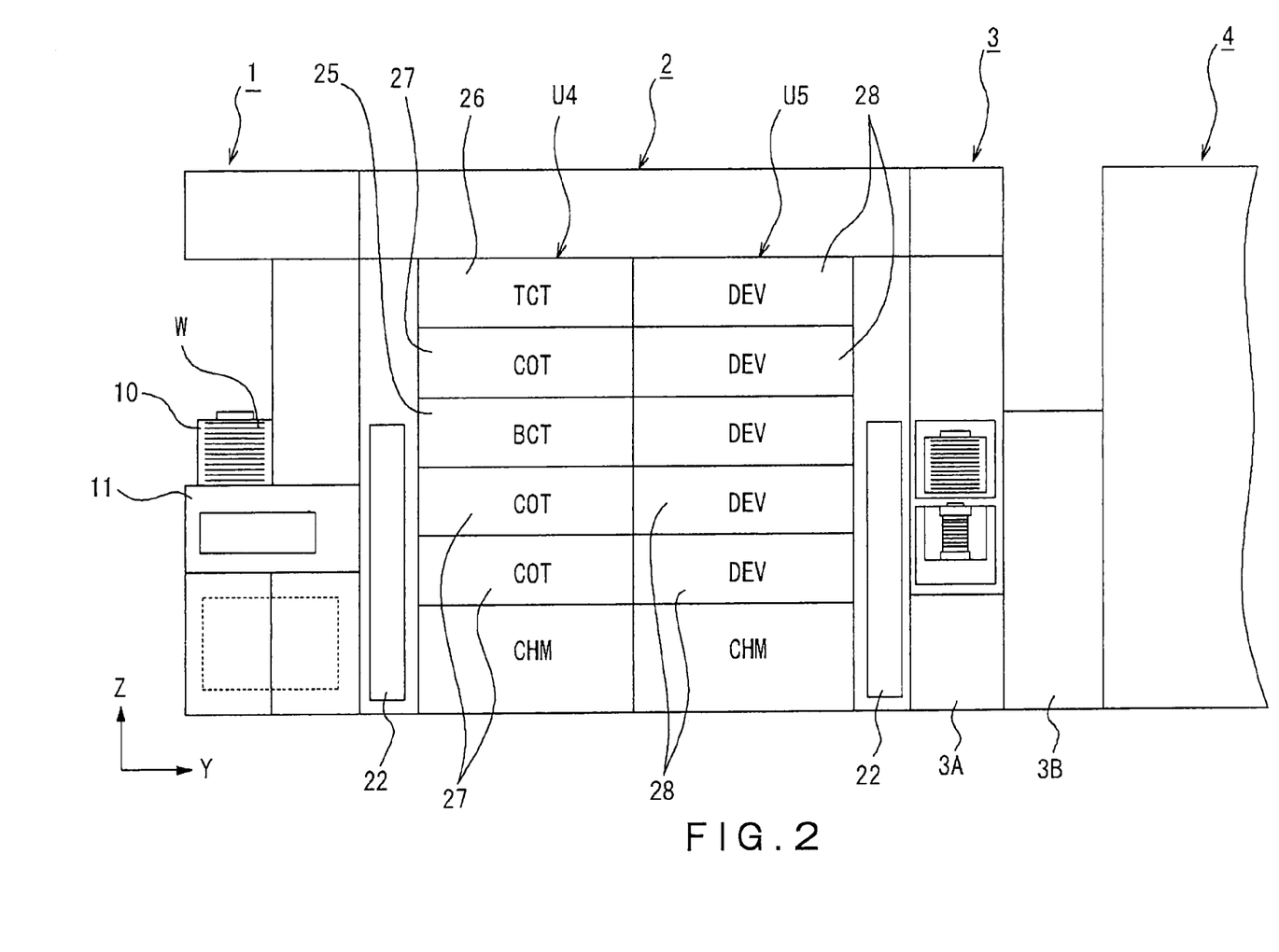
FIG. 2 is a schematic front elevation of the substrate processing system shown in FIG. 1.
Figure 3:
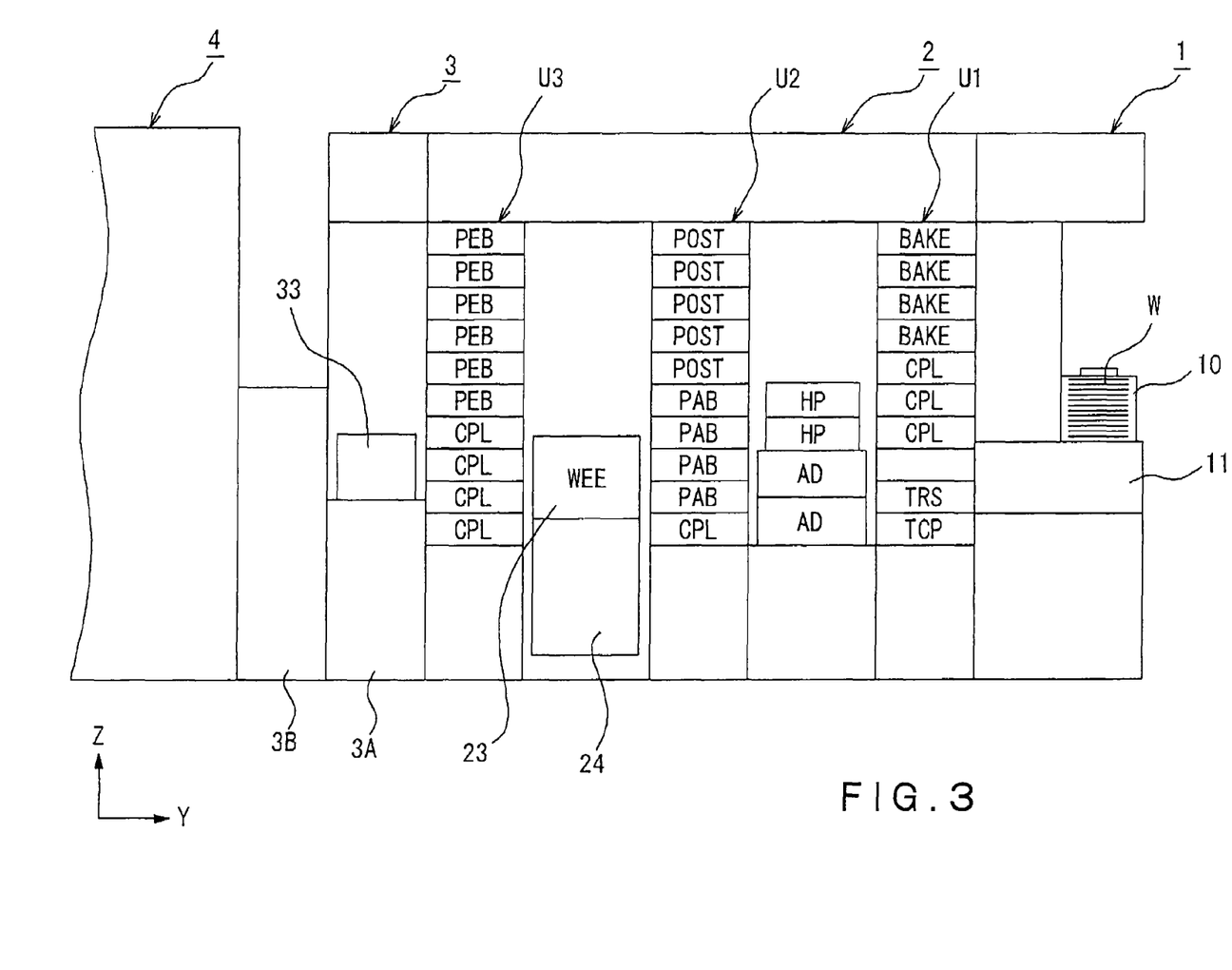
FIG. 3 is a schematic rear view of the substrate processing system shown in FIG. 1.

FIG. 1 is a schematic plan view of a substrate processing system in a preferred embodiment according to the present invention built by combining a coating and developing system and an exposure system, FIG. 2 is a schematic front elevation of the substrate processing system, and FIG. 3 is a schematic rear view of the substrate processing system.

The substrate processing system includes a carrier station 1, a processing block 2, an interface block 3, and an exposure system 4. A sealed carrier 10 containing a plurality of semiconductor wafers (herein after, referred to simply as "wafers") W, for example twenty-five wafers W, is delivered to and sent out from the carrier station 1. The processing block 2 processes a wafer W received from the carrier station 1 by a resist application process, a developing process and such. The exposure system 4 processes a surface of a wafer W coated with an immersion liquid layer by an immersion exposure process.

The carrier station 1 is provided with a carrier platform 11 on which a plurality of carriers 10 are supported, a wall disposed behind the carrier platform 11 and provided with closable openings 12, and a transfer device A1 for taking out a wafer W from the carrier 10 through the closable opening 12.

The processing block 2 surrounded by a box 20 is disposed behind and joined to the carrier station 1. In the processing block 2, processing units U1, U2 and U3 each including heating and cooling modules stacked in layers are longitudinally arranged in that order on the left-hand side as viewed from the carrier station 1, wet-processing units U4 and U5 are arranged longitudinally in that order on the right-hand side, as viewed from the carrier station 1, and main carrying devices A2 and A3 are arranged longitudinally. The processing units U1, U2 and U3, and the main carrying devices A2 and A3 are arranged alternately. The main carrying devices A2 and A3 carry a wafer from one to another of the processing units U1, U2 and U3, and the wet processing units U4 and U5. Each of the main carrying devices A2 and A3 is disposed in a space surrounded by a wall 21 having a part on the side of the processing units U1, U2 and U3, a part on the side of the wet processing units U4 and U5, and a back part, namely, a left part. Temperature and humidity conditioning units 22 including a temperature regulating devices for regulating the respective temperatures of processing solutions to be used by the units, and air conditioning ducts are interposed between the carrier station 1 and the processing block 2 and between the processing block 2 and the interface block 3, respectively.

The processing units U1, U2 and U3 are built by stacking up, for example in ten layers, pretreatment modules for pretreating wafers W before processing the wafers W by the wet-processing units U4 and U5, and posttreatment modules for posttreating wafers W processed by the wet processing units U4 and U5. For example, two adhesion modules AD for processing a wafer W by a hydrophobic property imparting process, and two heating modules HP for heating a wafer W are stacked up in that order as shown in FIG. 3. The adhesion modules (AD) may be provided with a mechanism for controlling the temperature of a wafer W. Disposed on the back side of the main carrying device A3 are an edge exposure system (WEE) 23, and a thickness measuring device 24 for measuring the thickness of a resist film formed on a wafer W. The edge exposure system (WEE) 23 and the thickness measuring device 24 may be stacked up in layers. In some cases, thermal processing modules are disposed on the back side of the main carrying device A3 as well as on the back side of the main carrying device A2.

Referring to FIG. 3, in the processing unit 1, for example, high-temperature thermal processing modules (BAKE), namely, first thermal processing units of an oven type for processing a wafer W by a predetermined thermal process, precision temperature control modules (CPL) for accurately controlling the temperature of a wafer W, a transfer module (TRS) through which a wafer W is transferred from the transfer device A1 to the main carrying device A2, and a temperature control unit (TCP) are arranged vertically down in that order, for example in ten layers. In this embodiment, the processing unit U1 includes a spare space at the third layer from the bottom. In the processing unit U2, for example, post baking modules (POST), namely, fourth thermal processing modules, prebaking modules (PAB) for processing a wafer W coated with a resist film by a heating process, and a precision temperature control module (CPL) are arranged vertically down in that order, for example, in ten layers. In the processing unit U3, for example, postexposure baking modules (PEB), namely, a third thermal processing modules for processing a wafer W by a heating process after the wafer W has been processed by an exposure process, and precision temperature control modules (CPL) are arranged vertically down in that order, for example, in ten layers Referring to FIG. 2, the wet processing unit U4 is built, for example, by stacking a bottom antireflection film forming module (BCT) 25, top antireflection film forming module (TCT), resist application modules (COT) 27 in five layers on a chemical solution storage unit (CHM). The wet processing unit U5 is built, for example, by stacking developing modules (DEV) 28 for processing a wafer W by a developing process using a developer in five layers on a chemical solution storage unit (CHM).

Figure 4:
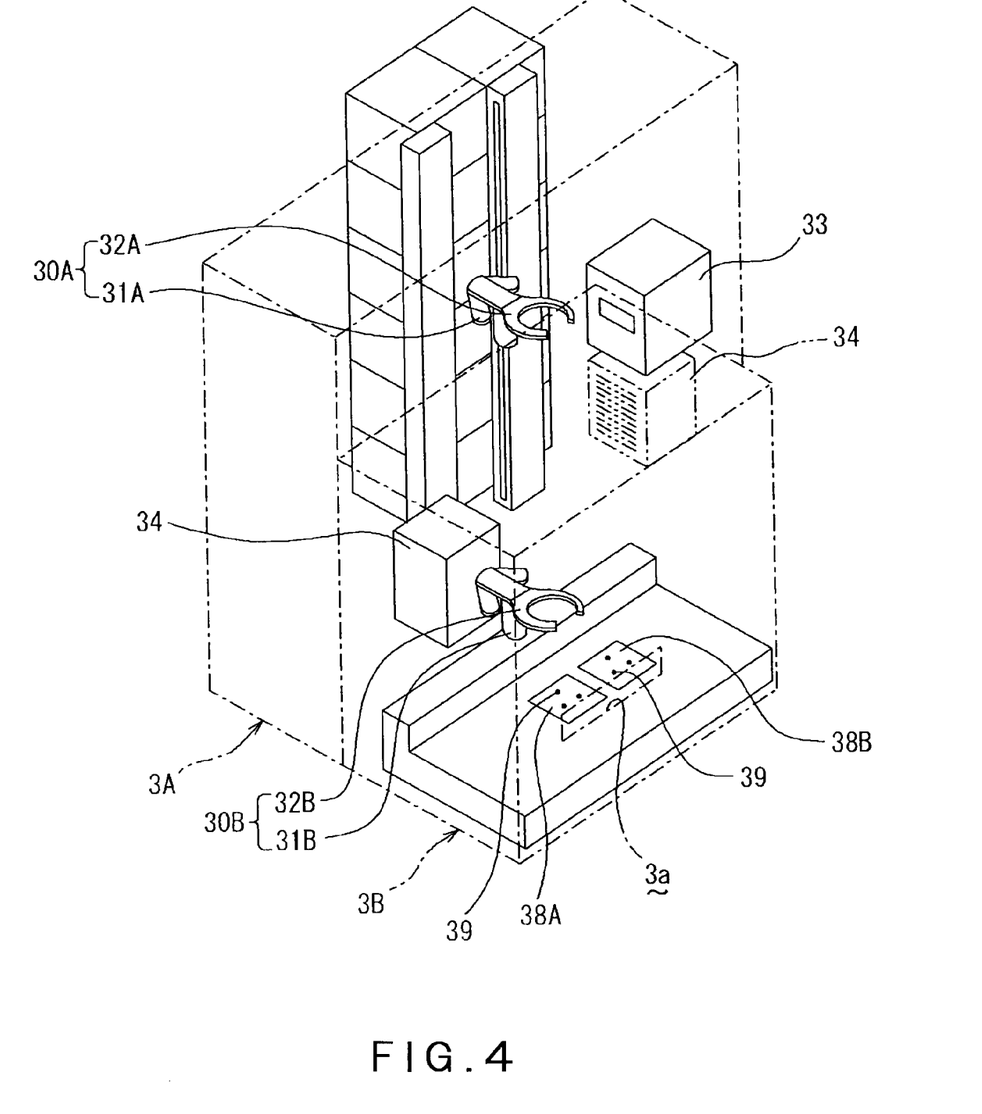
FIG. 4 is a perspective view of an interface block according to the present invention.

Referring to FIG. 4, the interface block 3 has a first carrying chamber 3A and a second carrying chamber 3B. The first carrying chamber 3A and the second carrying chamber 3B are arranged longitudinally. A first wafer carrying device 30A and a second wafer carrying device 30B are installed in the first carrying chamber 3A and the second carrying chamber 3B, respectively. The first wafer carrying device 30A includes a base 31A capable of vertically moving and of turning about a vertical axis, and an arm 32A mounted on the base 31A so as to move forward and backward. The second wafer carrying device 30B includes a base 31B capable of vertically moving and of turning about a vertical axis, and an arm 32B mounted on the base 31B so as to move forward and backward.

A controller 70 times carrying operations of the wafer carrying devices 30A and 30B and controls carrying time in which the wafer carrying devices 30A and 30B carry a wafer W. The controller 70 includes, as a principal component, a control computer 60 provided with a central processing unit (CPU).

In the first carrying chamber 3A, a protective film inspecting device 33 is disposed on the left-hand side, as viewed from the carrier station 1, of the first wafer carrying device 30A, and a buffer cassette 34 is disposed on the right-hand side, as viewed from the carrier station 1, of the first wafer carrying device 30A. The protective film inspecting device 33 detects surface defects, such as depressions, in the surface of a protective film. The buffer cassette 34 stores a plurality of wafers W, for example, twenty-five wafers W, in vertically arranged layers. The buffer cassette 34 may be disposed below the protective film inspecting device 33.

Figure 5:
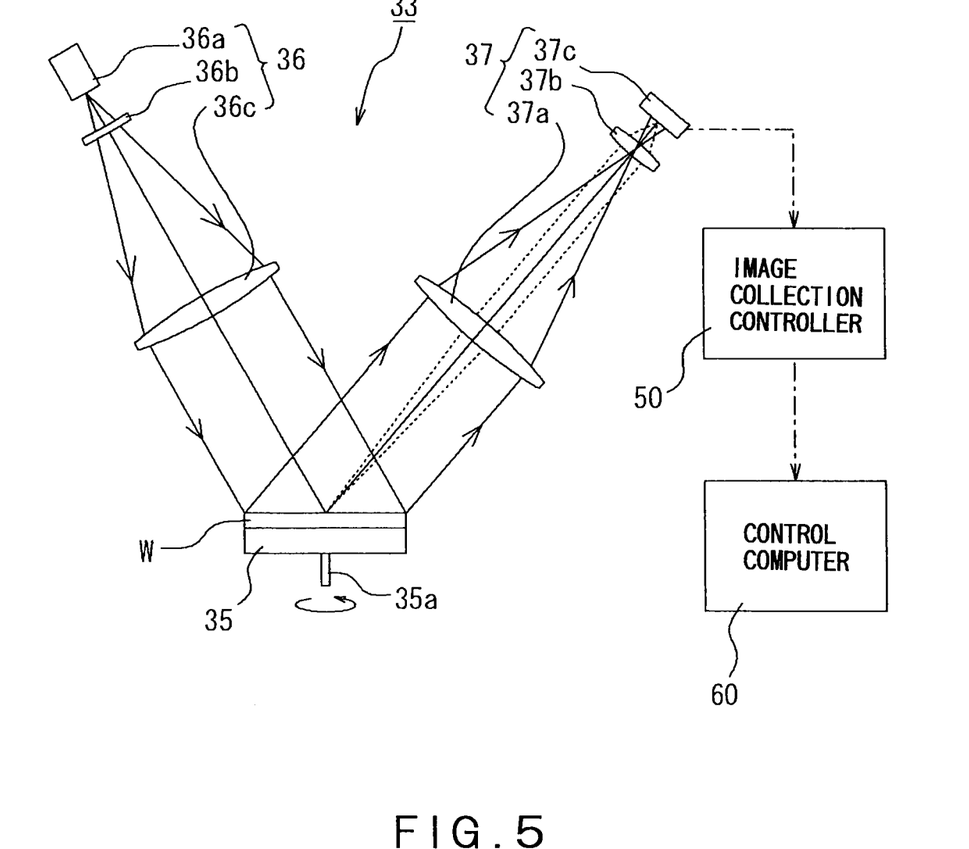
FIG. 5 is a diagrammatic view of a protective film inspecting device according to the present invention.

As shown in FIG. 5, the protective film inspecting device 33 includes, as principal components, a rotating support table 35 for supporting a wafer W thereon, an illuminating unit 36 for illuminating a surface of a wafer supported on the support table 35 with inspection light, and a light-receiving unit 37 for receiving scattered light rays reflected by the surface of the wafer W illuminated with the inspection light emitted by the illuminating unit 36.

A rotating shaft 35a extends down from the lower surface of the support table 35. The rotating shaft 35a is driven by a drive motor, not shown, to rotate the support table 35 in a horizontal plane. A vacuum device, not shown, is connected to the support table 35 to hold a wafer W on the support table 35 by suction.

The illuminating unit 36 illuminates a surface of a wafer W with the inspection light. The illuminating unit 36 includes, for example, a light source 36a, a wave filter 36b for separating light waves on the basis of their wavelength, and a projection lens 36c for gathering inspection light passed through the wave filter 36b in a light beam of parallel light rays, and projecting the light beam on a surface of a wafer W.

The light-receiving unit 37 includes, for example, a first lens 37a, a second lens 37b, and an image pickup device 37c including a CCD. An image collection controller 50 for collecting image data provided by the image pickup device 37c including the CCD is electrically connected to the image pickup device 37c including the CCD of the light-receiving unit 37. Image data collected by the image collection controller 50 is given to the control computer 60, namely, a control means. The control computer 60 compares the image data with previously stored reference image data obtained through evaluation tests or the like to decide whether or not surface defects in the protective film are normal, i.e., whether the surface defects do not cause troubles in an exposure process (normal) or whether the surface defects cause troubles in the exposure process (abnormal). The protective film can be rated normal or abnormal on the basis of the number of surface defects, such as depressions, in the surface of the protective film. For example, the protective film is rated at a grade A when the number of the surface defects is five or below and there is no possibility of elution of the components of the resist, at a grade B when the number of the surface defects is greater than five and below twenty and there will be slight elution of the components of the resist that will not impose difficulty on the exposure process or at a grade C when the number of surface defects is twenty or above and there will be considerable elution of the components of the resist that will impose serious difficulty on the exposure process. The control computer 60 gives information about the surface defects in the protective film thus obtained through the controller 70 to the exposure system 4.

Transfer stages 38A and 38B are arranged laterally in the second carrying chamber 3B. A wafer W is transferred between the exposure system 4 and either of the transfer stages 38A and 38B through an opening 3a. Each of the transfer stages 38A and 38B is provided on its surface with, for example, three support pins 39.

The first wafer carrying device 30A and the second wafer carrying device 30B are electrically connected to the controller 70. Carrying operations of the wafer carrying devices 30A and 30B are controlled by control signals provided by the controller 70. The first wafer carrying device 30A carries out operations for receiving a wafer W coated with a protective film from the processing block 2, carrying the same wafer W to the protective film inspecting device 33 and carrying the same wafer W to the buffer cassette 34, and operations for receiving a wafer W processed by an exposure process from the second wafer carrying device 30B and carrying the same wafer to the processing block 2. The second wafer carrying device 30B carries out operations for receiving a wafer not yet processed by the exposure process from the first wafer carrying device 30A and transferring the same wafer W to the exposure system 4, and operations for receiving a wafer W processed by the exposure process from the exposure system 4 and transferring the same wafer W to the first wafer carrying device 30A.

The wafer carrying system of the interface block 3 is required to efficiently carry out operations for carrying a wafer W from the processing block 2 to the exposure system 4, and carrying a wafer W from the exposure system 4 to the processing block 2. In this embodiment, the control computer 60 calculates moving times for all the wafers W of a lot by using carrying routes and the respective carrying speeds of the transfer device A1 and the carrying devices A2, A3, 30A, and 30B, specifies the nearest (the earliest) one of the positions in the buffer cassette 34, and places the wafer W at the specified position in the buffer cassette 34. Since the wafer W is thus stored at the nearest (the earliest) position in the buffer cassette 34, wafers W can be efficiently carried and, consequently, the throughput of the substrate processing system can be improved.

Figure 6A:
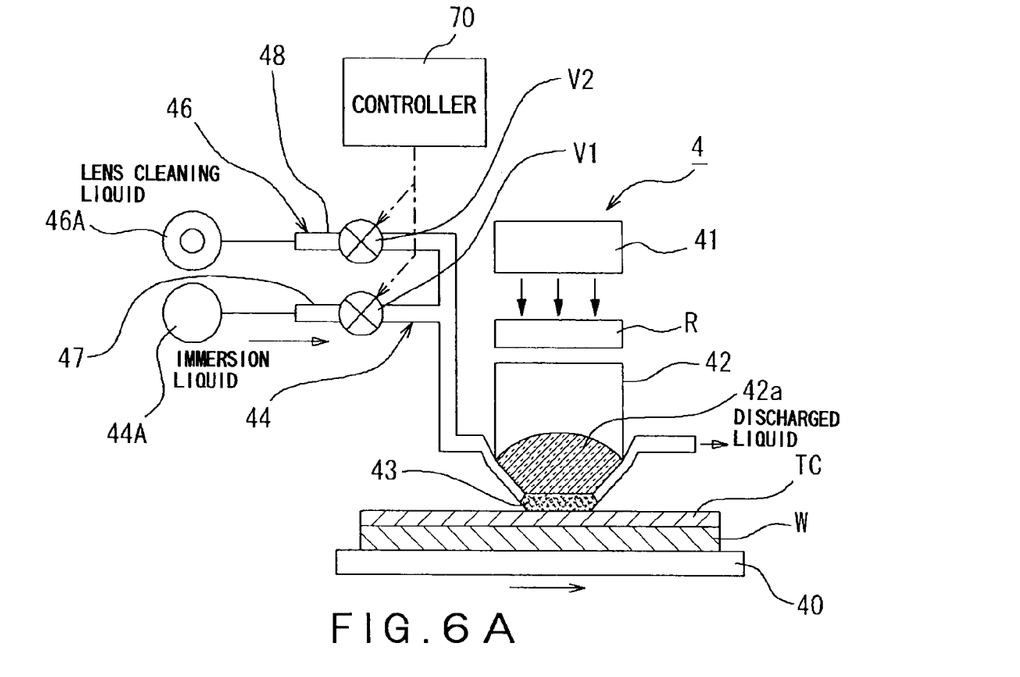
FIGS. 6A and 6B are a schematic sectional view of assistance in explaining an exposure process and an exposure lens cleaning process of the exposure system.
Figure 6B:
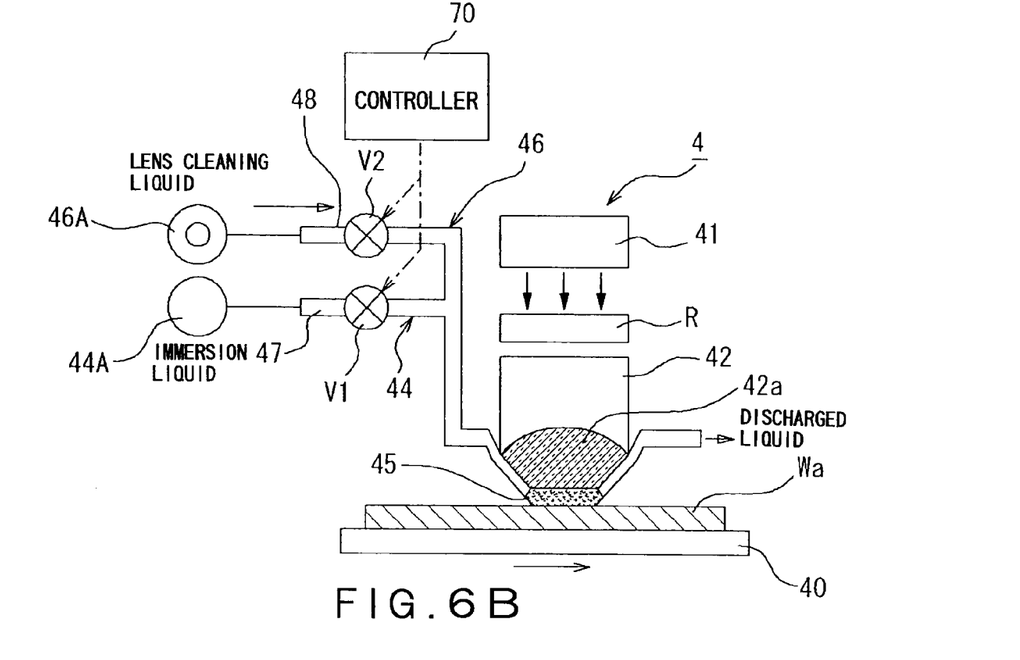

Referring to FIGS. 6A and 6B, the exposure system 4 includes a stage 40 capable of supporting a wafer W (or a dummy wafer Wa for use in a cleaning process) and of being horizontally moved by a moving mechanism; a reticle R, namely, a photomask provided with a circuit pattern; an exposure light source 4, projection system 42 for projecting exposure light emitted by the exposure light source 41 and passed through the reticle R on a protective film TC formed on a surface of a wafer W; an immersion liquid supply unit 44 for supplying an immersion liquid 43, such as pure water, into a space between an exposure lens 42a included in the projection system 42, and the protective film; a lens cleaning liquid supply unit (hereinafter referred to simply as "cleaning liquid supply unit") 46 for supplying a lens cleaning liquid 45, such as an organic solvent or a surface reactive agent, into a space between the exposure lens 42a and the dummy wafer Wa mounted on the stage 40; an immersion liquid supply line 47 connected to an immersion liquid source 44A included in the immersion liquid supply unit 44 and provided with a first shutoff valve V1; and a cleaning liquid supply line 48 connected to a cleaning liquid source 46A included in the cleaning liquid supply unit 46 and provided with a second shutoff valve V2.

The first shutoff valve V1 and the second shutoff valve V2 are electrically connected to the controller 70. The first shutoff valve V1 and the second shutoff valve V2 are controlled by control signals provided by the controller 70. The exposure lens 42a is cleaned by a cleaning process by operating the first shutoff valve V1 and the second shutoff valve V2 according to the degree of surface defects when the surface defects in the protective film are normal. More concretely, when the number of surface defects in the protective film is greater than five and below twenty and the protective film is rated at the grade B, the first valve V1 and the second valve V2 are operated so as to stop supplying the immersion liquid 43 and supply the lens cleaning liquid 45 into the space between the dummy wafer Wa mounted on the stage 40 and the exposure lens 42a as shown in FIG. 6B to clean the exposure lens 42a by the lens cleaning liquid 45 after the completion of the exposure process or during the suspension of the exposure process. In this embodiment, the first shutoff valve V1 is placed in the immersion liquid supply line 47, and the second shutoff valve V2 is placed in the cleaning liquid supply line 48. A single selector valve may be placed in the immersion liquid supply line 47, and the cleaning liquid source 46A may be connected to the selector valve by the cleaning liquid supply line 48.

A carrying device 49 is disposed in the exposure system 4 to carry a wafer W through the opening 3a of the interface block 3 onto the stage 40 and to carry a wafer W from the stage 40 into the interface block 3. The carrying device 49 is electrically connected to the control computer 60 of the controller 70. The controller 70 generates a control signal on the basis of the image data provided by the protective film inspecting device 33 to control carrying operations for carrying a wafer W or the dummy wafer Wa. The dummy wafer Wa is held at a waiting position in the exposure system 4 or in the buffer cassette 34. The carrying device 49 carries the dummy wafer Wa onto the stage 40 when the exposure lens 42a needs cleaning.

Figure 7:
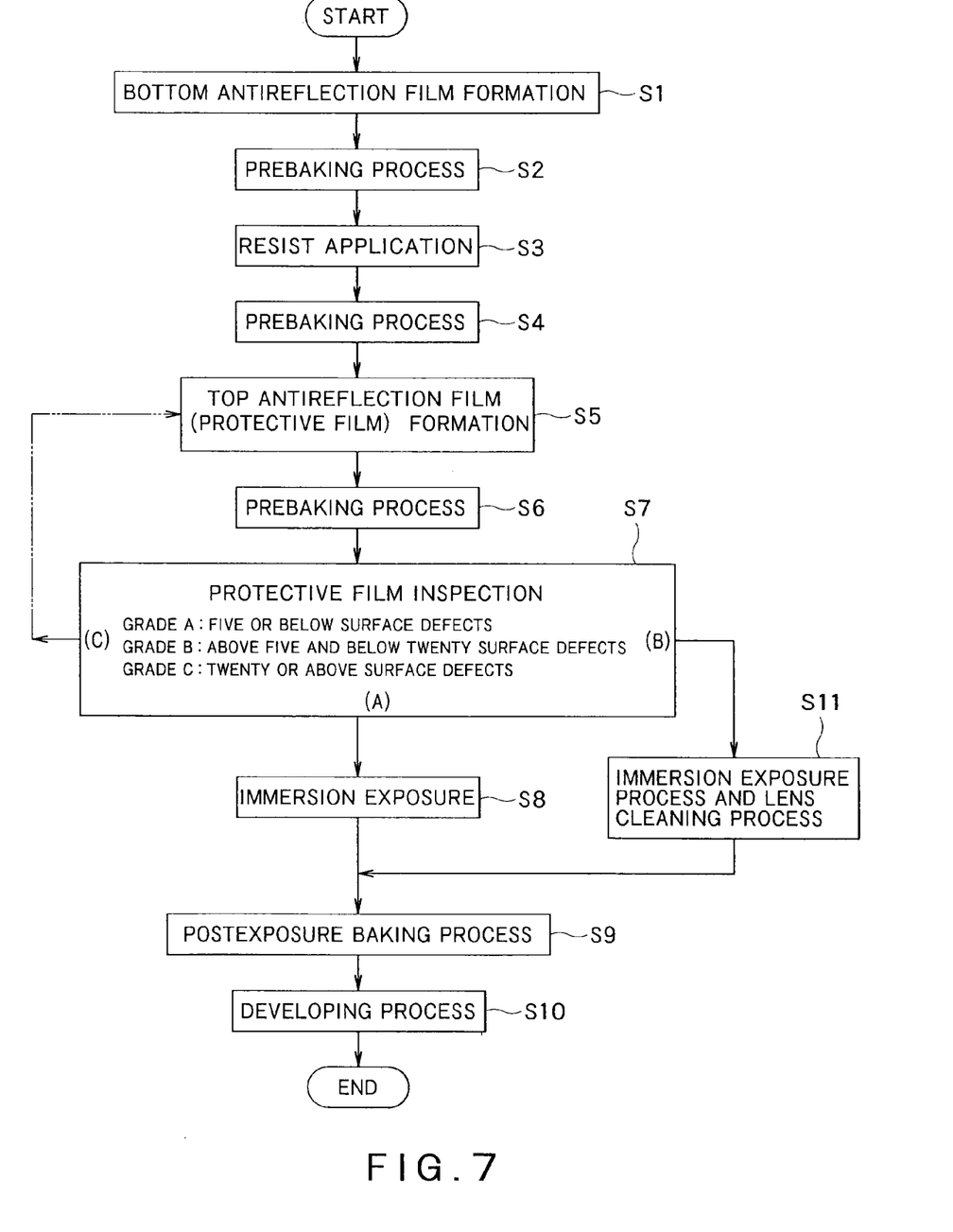
FIG. 7 is a flow chart of an example of a procedure including a coating process, an exposure process and a developing process.

A wafer processing procedure to be executed by the coating and developing system to process a wafer W will be described with reference to a flow chart shown in FIG. 7. The wafer processing procedure will be described as applied to forming a bottom antireflection film BARC, a resist film, and a top antireflection film TC (hereinafter referred to as "protective film TC") in that order on a surface of a wafer W. A carrier 10 containing, for example, twenty-five wafers W is delivered to the carrier platform 11. Then, the closable opening 12 and the lid of the carrier 10 are opened, and the transfer device A1 takes out a wafer W from the carrier 10. The wafer W is transferred through the transfer module TRS included in the processing unit U1 to the main carrying device A2. Then, the wafer W is subjected to a pretreatment process in step S1. The pretreatment process forms, for example, a bottom antireflection film (BARC) on a surface of the wafer W by the bottom antireflection film forming module (BCT) 25. After the bottom antireflection film (BARC) has been formed, the main carrying device A2 carries the wafer W to the heating module of the processing unit U1 to subject the wafer W to a prebaking process (CLHP) in step S2.

Then, the main carrying device A2 carries the wafer W to the resist application module (COT) 27 and a thin resist layer is formed over the entire surface of the wafer W in step S3. The main carrying device A2 carries the wafer W coated with the resist layer to the heating module of the processing unit U2 to subject the wafer to a prebaking process (CLHP) in step S4.

Then, the main carrying device A2 carries the wafer W to the protective film forming module (TCT) 26 to form a protective film TC on the resist layer in step S5. After the protective film TC has been formed, the main carrying device A2 carries the wafer W to the heating module of the processing unit U2 to subject the wafer W to a prebaking process (CLHP) in step S6.

Then, the main carrying device A3 carries the wafer W to the transfer module, not shown. Then, the arm 32A of the interface block 3 carries the wafer W into the protective film inspecting device 33. Then, as mentioned above, the protective film inspecting device 33 inspects the surface of the protective film TC for defects to decide whether or not the surface defects in the surface of the protective film TC is normal; that is, the protective film inspecting device 33 decides whether the components of the resist dissolved in the immersion liquid during the immersion exposure process will not cause difficulty in the exposure process (normal) or whether the components of the resist dissolved in the immersion liquid during the immersion exposure process will cause difficulty in the exposure process (abnormal). More concretely, the protective film inspecting device 33 rates the protective film at the grade A when the number of the surface defects is five or below and there is no possibility of elution of the components of the resist, at the grade B when the number of the surface defects is greater than five and below twenty and there will be slight elution of the components of the resist that will not impose difficulty on the exposure process or at the grade C when the number of surface defects is twenty or above and there will be considerable elution of the components of the resist that will impose serious difficulty on the exposure process in step S7.

When the number of surface defects in the protective film TC is five or below and the protective film TC is rated at the grade A, the arm 32A carries out the wafer W from the protective film inspecting device 33 and transfers the wafer W to the second wafer carrying device 30B, and the second wafer carrying device 30B places the wafer W on the transfer stage 38A. Then, in step S8, the controller 70 gives a control signal to the carrying device 49 of the exposure system 4 to carry the wafer W through the opening 3a into the exposure system 4, and an immersion liquid layer is formed between the surface of the wafer W and the exposure lens 42a, and then the wafer W is subjected to the immersion exposure process as shown in FIG. 6A.

The carrying device, not shown, carries the wafer W processed by the immersion exposure process onto the transfer stage 38B. Then, the first wafer carrying device 30A carries the wafer W to the postexposure baking module (PEB). Then, in step S9, the wafer W is cooled roughly and is heated at a predetermined temperature for a post exposure baking process for diffusing an acid produced by an acid producing agent contained in the resist in the resist film. The acid thus produced causes the components of the resist to interact chemically. When the resist is a positive resist, areas of the resist film in which the chemical reaction occurred are dissolvable in a developer.

Then, in step S10, the main carrying device A3 carries the wafer W processed by the PEB process into the developing module (DEV) 28, and a developer pouring nozzle included in the developing module (DEV) 28 pours a developer onto the wafer W to process the wafer W by a developing process. Parts of the resist film dissolvable in the developer are removed to form a predetermined resist pattern. Then, the wafer W is rinsed by a rinsing process using a rinsing liquid such as pure water, and the wafer W is dried by a spin drying method that shakes the rinsing liquid off the wafer W. The developing module may be provided with a drying gas spouting nozzle for spouting a drying gas, such as dry air or dry nitrogen gas, and the wafer W may be more completely dried by blowing the drying gas against the wafer W instead of drying the wafer W by the spin drying method or by blowing the drying gas against the wafer W while the wafer W is being dried by the spin drying method. Then, the main carrying device A3 carries the wafer W out of the developing module (DEV) 28, and the wafer W is returned into the carrier 10, from which the wafer W was taken out, placed on the carrier platform 11 by the main carrying device A2 and the transfer device A1. Then, a series of coating and developing processes are completed.

A wafer W having a protective film TC rated at the grade B by the protective film inspecting device 33, that is, the number of surface defects in the protective film TC is above five and below twenty, as well as a wafer W having a protective film TC rated at the grade A, that is, the number of surface defects in the protective film TC is five or below, is carried through the opening 3a into the exposure system 4 by the carrying device 49 of the exposure system 4 and, in step S11, the wafer W is subjected to the immersion exposure process that forms an immersion liquid layer between the surface of the wafer W and the exposure lens 42a. This wafer W is processed by the postexposure baking process (step S9) and the developing process (step S10), and is returned to the carrier 10 from which the wafer W was taken out. In this case, after the completion of the immersion exposure process in step S11, the carrying device 49 operates according to control signals provided by the controller 70 to mount the dummy wafer Wa held at the waiting position or stored in the buffer cassette 34 on the stage 40. Then, the exposure lens 42a is cleaned by the cleaning liquid 45 by operating the first shutoff valve V1 and the second shutoff valve V2 to supply the lens cleaning liquid 45 into a space between the dummy wafer Wa and the exposure lens 42a as shown in FIG. 6B. The exposure lens 42a may be periodically cleaned during the suspension of the exposure process.

Although a wafer W having a protective film TC rated at the grade C by the protective film inspecting device 33, that is, the number of surface defects in the protective film TC is twenty or above, is carried into the exposure system 4, the carrying device 49 carries the same wafer W according to control signals given thereto by the controller 70 to return the wafer W to the interface block 3. Thus the wafer W having the protective film TC rated at the grade C is not processed by the immersion exposure process. This wafer W returned to the interface block 3 may be ejected from the coating and developing system after temporarily storing the same in the buffer cassette 34 or may be returned to the protective film forming module (TCT) 24 as indicated by a two-dot chain line in FIG. 7 to form a protective film TC again on the same wafer W. The wafer W may be processed by the developing module (DEV) 28 to remove the previous protective film TC, the wafer W may be rinsed by pure water and may be dried by spin drying before forming a protective film TC again on the wafer W.

Wafers W having a protective film TC having surface defects rated abnormal are not processed by the immersion exposure process, and only wafers W having a protective film TC having surface defects rated normal are processed by the immersion exposure process. Thus adhesion of the components of the resist dissolved in the immersion liquid to the exposure lens 42*a* can be prevented and hence accurate exposure can be ensured.

What is claimed is:

1. A substrate processing method comprising the steps of:

coating a surface of a substrate with a resist film;

coating the surface of the resist film with a protective film;

processing the surface of the substrate by an exposure process with the surface of the substrate coated with a transparent immersion liquid layer; and processing the surface of the substrate by a developing process;

wherein surface defects in the surface of the protective film are detected by a protective film inspecting means before subjecting the substrate provided with the protective film to the exposure process by an exposure system, a decision is made to see whether or not the surface defects in the surface of the protective film is normal when the protective film is wetted with the immersion liquid layer, and the substrate is subjected to the exposure process when it is decided that the surface defects are normal or is not subjected to the exposure process when it is decided that the surface defects are abnormal, wherein the exposure system is provided with an immersion liquid supply unit for supplying the immersion liquid into a space between an exposure lens and the surface of the substrate, a cleaning liquid supply unit for supplying a lens cleaning liquid for cleaning the exposure lens into the space between the exposure lens and the surface of the substrate, and shutoff valves placed in supply lines connected to the immersion liquid supply unit and the cleaning liquid supply unit, respectively, to supply the immersion liquid or the lens cleaning liquid selectively, and the shutoff valves are operated according to the degree of surface defects in the protective film to supply the lens cleaning liquid for a lens cleaning process after the completion of the exposure process when the surface defects in the protective film are normal.

2. A substrate processing system provided with a resist film forming module for forming a resist film on a surface of a substrate, a protective film forming module for forming a protective film on the resist film, an exposure system for processing the surface of the substrate coated with a transparent immersion liquid layer by an exposure process, and a developing module for processing the substrate by a developing process using a developer; said substrate processing system comprising:

a protective film inspecting means for inspecting the surface of a protective film formed on a surface of the substrate; and a control means that receives information about the result of inspection of the protective film from the protective film inspecting means, rates surface defects in the surface of the protective film, and gives an exposure process execution signal requesting processing the substrate by the exposure process to the exposure system when the surface defects in the protective film are rated normal or gives an exposure process not executing signal requesting not processing the substrate by the exposure process to the exposure system when the surface defects in the protective film are rated abnormal, wherein the exposure system is provided with an immersion liquid supply unit for supplying an immersion liquid into a space between an exposure lens and the surface of the substrate, a cleaning liquid supply unit for supplying a lens cleaning liquid for cleaning the exposure lens into the space between the exposure lens and the surface of the substrate, and shutoff valves placed in supply lines respectively connected to the immersion liquid supply unit and the cleaning liquid supply unit, respectively, to supply the immersion liquid or the lens cleaning liquid selectively, and the shut off valves are operated by control signals provided by the control means according to the degree of surface defects to supply the lens cleaning liquid for a lens cleaning process after the completion of the exposure process when the surface defects in the protective film are rated normal.

* * * * *